United States Patent
Mueller-Mach et al.

(10) Patent No.: US 7,038,370 B2
(45) Date of Patent: May 2, 2006

(54) PHOSPHOR CONVERTED LIGHT EMITTING DEVICE

(75) Inventors: Regina B. Mueller-Mach, San Jose, CA (US); Gerd O. Mueller, San Jose, CA (US); Thomas Juestel, Witten (DE); Wolfgang Busselt, Roetgen (DE); Peter J. Schmidt, Aachen (DE); Walter Mayr, Alsdorf (DE)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 10/785,620

(22) Filed: Feb. 23, 2004

(65) Prior Publication Data

US 2004/0256974 A1    Dec. 23, 2004

(51) Int. Cl.
*H01J 1/62* (2006.01)
*H01J 63/04* (2006.01)

(52) U.S. Cl. .............. 313/485; 313/512; 313/486; 313/487; 252/301.4 R

(58) Field of Classification Search ........ 313/483–487, 313/503, 512, 581; 252/301.4 R, 301.4 F, 252/301.4 S; 257/98–100; 315/169.3, 169.4; 345/36, 37, 41, 45, 47, 60, 75, 76

See application file for complete search history.

(56) References Cited

U.S. PATENT DOCUMENTS

| | | | |
|---|---|---|---|
| 5,998,925 A | 12/1999 | Shimizu et al. | |
| 6,501,100 B1 * | 12/2002 | Srivastava et al. | 257/79 |
| 6,552,487 B1 * | 4/2003 | Ellens et al. | 313/503 |
| 6,576,930 B1 | 6/2003 | Reeh et al. | |
| 2004/0007961 A1 | 1/2004 | Srivastava et al. | |
| 2004/0173807 A1 * | 9/2004 | Tian et al. | 257/98 |

\* cited by examiner

*Primary Examiner*—Ashok Patel
*Assistant Examiner*—Anthony J. Canning
(74) *Attorney, Agent, or Firm*—Patent Law Group LLP

(57) ABSTRACT

A system includes a radiation source capable of emitting first light and a fluorescent material capable of absorbing the first light and emitting second light having a different wavelength than the first light. The fluorescent material is a phosphor having the formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$. In some embodiments, the $(Lu_{1-x-y-a-b}Y_xGd_y)_3(Al_{1-z}Ga_z)_5O_{12}:Ce_aPr_b$ is combined with a second fluorescent material capable of emitting third light. The second fluorescent material may be a red-emitting phosphor, such that the combination of first, second, and third light emitted from the system appears white.

22 Claims, 7 Drawing Sheets

PHOSPHOR CONVERTED LIGHT EMITTING DEVICE

BACKGROUND

1. Field of Invention

The present invention generally relates to an illumination system comprising a radiation source and a fluorescent material comprising a phosphor.

2. Description of Related Art

Recently, various attempts have been made to make white light emitting illumination systems by using light emitting diodes (LEDs) as radiation sources. When generating white light with an arrangement of red, green and blue light emitting diodes, there has been such a problem that white light of the desired tone cannot be generated due to variations in the tone, luminance and other factors of the light emitting diodes.

In order to solve these problems, there have been previously developed various illumination systems, which convert the color of light emitted by light emitting diodes, by means of a fluorescent material comprising a phosphor to provide a visible white light illumination.

Previous illumination systems have been based in particular either on the trichromatic (RGB) approach, i.e. on mixing three colors, namely red, green and blue, in which case the latter component may be provided by a phosphor or by the primary emission of the LED or in a second, simplified solution, on the dichromatic (BY) approach, mixing yellow and blue colors, in which case the yellow component may be provided by a yellow phosphor and the blue component may be provided by the primary emission of blue LED.

In particular, the dichromatic approach as disclosed in, for example, U.S. Pat. No. 5,998,925 uses a blue light emitting diode of InGaN semiconductor combined with a $Y_3Al_5O_{12}$:$Ce^{3+}$ (YAG-$Ce^{3+}$) phosphor. The YAG-$Ce^{3+}$ phosphor is coated on the InGaN LED, and a portion of the blue light emitted from the LED is converted to yellow light by the phosphor. Another portion of the blue light from the LED is transmitted through the phosphor. Thus, this system emits both blue light emitted from the LED, and yellow light emitted from the phosphor. The mixture of blue and yellow emission bands are perceived as white light by an observer with a CRI in the middle 80s and a color temperature, $T_e$, that ranges from about 6000 K to about 8000 K.

However, white light LEDs based on the dichromatic approach can only be used to a limited extent for general-purpose illumination, on account of their poor color rendering caused by the absence of red color components.

SUMMARY

In accordance with embodiments of the invention, a system includes a radiation source capable of emitting first light and a fluorescent material capable of absorbing the first light and emitting second light having a different wavelength than the first light. The fluorescent material is a phosphor having the formula $(Lu_{1-x-y-a-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$. In the $(Lu_{1-x-y-a-b}Y_xGd_y)_3(Al_{1-z}Ga_z)_5O_{12}$:$Ce_aPr_b$ is combined with a second fluorescent material capable of emitting third light. The second fluorescent material may be a red-emitting phosphor, such that the combination of first, second, and third light emitted from the system appears white.

DETAILED DESCRIPTION

Figure 1:
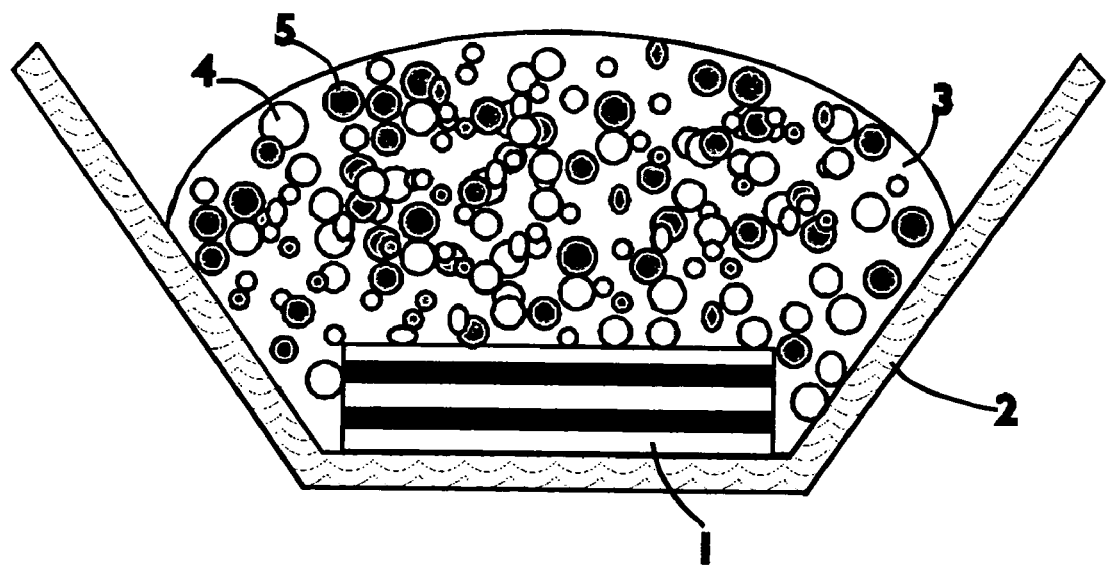
FIG. 1 shows a schematic view of a tri-color white LED lamp comprising a two-phosphor blend positioned in a pathway of light emitted by an LED structure.

Embodiments of the invention provide new phosphors that are excitable in the near UV-to-blue range and emit in the visible green range. The new phosphors are capable of absorbing a part of light emitted by a radiation source and emitting light of a wavelength different from the absorbed light.

Embodiments of the present invention focus on a lutetium aluminum garnet as a phosphor in any configuration of an illumination system containing a radiation source, including, but not limited to discharge lamps, fluorescent lamps, LEDs, laser diodes and X-ray tubes. In some embodiments, the lutetium aluminum garnet phosphor is cerium-activated. As used herein, the term "radiation" encompasses radiation in the UV, IR and visible regions of the electromagnetic spectrum.

While the use of the present phosphor is contemplated for a wide array of illumination, the present invention is described with particular reference to and finds particular application to light emitting diodes, especially UV- and blue-light-emitting diodes.

The fluorescent material according to embodiments of the invention comprises as a phosphor a cerium-activated lutetium-aluminum-garnet compound. The phosphor conforms to the general formula $(Lu_{1-x-y-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$.

This class of phosphor material is based on activated luminescence of cubic garnet crystals. Garnets are a class of materials with the crystal chemical formula $A_3B_5O_{12}$.

A garnet crystal lattice has three different atomic occupying sites of dodecahedron octacoordination, octahedron hexacoordination and tetrahedron tetracoordination, in which the A cations are eight-coordinated with oxygens and the B cations are either octahedrally (six) or tetrahedrally (four) coordinated with oxygens. The crystal structure is cubic with 160 ions per unit cell containing eight formula units. In embodiments of the present invention, the A cations are lutetium ions alone or in combination with Yttrium and Gadolinium, in combinations and with activator substitutions of cerium and possibly praseodymium. The B cations may be aluminum and may be gallium or other ions, again, alone, in combinations and/or with substitutions. In particular, it was found that with activator ions substituted in the eight-coordinated or six-coordinated sites, these garnets are luminescent in response to x-ray stimulation. A particularly important activator ion, which is x-ray luminescent in this host material, is the $Ce^{3+}$ ion located in eight-coordinated sites.

Replacing some of the lutetium in a cerium activated lutetium aluminum garnet, $Lu_3Al_5O_{12}$:Ce phosphor with a smaller ion such as gadolinium $Gd^{3+}$ or yttrium $Y^{3+}$ causes a shift in the phosphor's emission band from green to the yellow range.

Replacing some of the aluminum in a cerium activated lutetium aluminum garnet, $Lu_3Al_5O_{12}$:Ce phosphor with a larger ion such as gallium $Ga^{3+}$ causes a shift in the phosphor's emission band from green to the blue range.

Replacing some of the cerium in a cerium-activated lutetium-aluminum-garnet by praseodymium as a co-activator has the effect that the praseodymium produces secondary emission that is concentrated in the red region of the visible spectrum, instead of a typical broadband secondary emission from cerium-activated lutetium-aluminum-phosphor that is generally centered in the yellow region of the visible spectrum. The amount of praseodymium as a co-activator can vary, depending on the amount of red color that may be required in the white output light for a particular application. Compositions having praseodymium as an activator cation present at low concentrations may be particularly desirable since such compositions show a sharp line emission in the red region of the visible spectrum.

The lutetium concentration influences the color locus of the emission light when used in a light source, in particular an LED. The color locus of this phosphor can be additionally fine-tuned using the ratio of the two concentrations Lu:Ce, which simplifies or optimizes adaptation to any further (yellow or red) phosphors in the LED. As the concentration of Ce in the phosphor increases, the blue-end of the emission spectrum of the phosphor shifts to longer wavelengths. In some embodiments, the phosphor contains about 1 to about 1.5 mole-percent Ce.

Preferably these garnet phosphors may be coated with a thin, uniform layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

The layer thickness customarily ranges from 0.001 to 0.2 μm and, thus, is so thin that it can be penetrated by the radiation of the radiation source without substantial loss of energy. The coatings of these materials on the phosphor particles can be applied, for example, by deposition from the gas phase or a wet-coating process.

The phosphors according to the invention are responsive to ultraviolet light as in fluorescent lamps and light emitting diodes, visible light as in blue-emitting diodes, electrons (as in cathode ray tubes) and x-rays (as in radiography).

The invention also concerns an illumination system comprising a radiation source and a fluorescent material comprising at least one phosphor of general formula $(Lu_{1-x-y-a-b}Y_xGd_y)_3(Al_{1-z}Ga_z)_5O_{12}$:$Ce_aPr_b$ wherein $0<x<1$, $0<y<1$, $0<z \leq 0.1$, $0<a \leq 0.2$ and $0<b \leq 0.1$.

Radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), etc.

Moreover, light emitting components such as those found in discharge lamps and fluorescent lamps, such as mercury low and high pressure discharge lamps, sulfur discharge lamps, and discharge lamps based an molecular radiators are also contemplated for use as radiation sources with the present inventive phosphor compositions.

In a preferred embodiment of the invention the radiation source is a light-emitting diode. Any configuration of an illumination system which includes a LED and a cerium-activated lutetium-aluminum garnet phosphor composition is contemplated in the present invention, preferably with addition of other well-known phosphors, which can be combined to achieve a specific color or white light of high efficiency and/or high color rendering index ("CRI") at a required color temperature, when irradiated by a LED emitting primary UV or blue light as specified above. White-emitting devices according to embodiments of the present invention are based on the combination of blue, red, and green colors. In some embodiments, the yellow to green and the red phosphors are so broad-banded that they have a sufficient proportion of emission throughout the whole spectral region.

In a preferred embodiment of the invention the primary radiation source used is the radiation from a UV-emitting or blue-emitting LED-chip. Particularly good results are achieved with a blue LED whose emission maximum lies at 400 to 480 nm. Optimal ranges have been found to lie at 445 to 460 nm and 438 to 456 nm, taking particular account of the excitation spectrum of the garnet phosphors described above.

Desirable white light lamp characteristics for general purposes are high brightness and high color rendering at economical cost. Improved efficiency and much improved color rendering ability is possible with the trichromatic lamp spectrum according to the RGB-approach having three emission bands: red at 590 to 630, green at 520 to 560 and blue at 450 nm. These wavelengths are near peaks in the CIE tristimulus functions, which are used to define colors.

In some embodiments, particularly good color rendering is achieved by the joint use of two phosphors, namely a green emitting cerium-activated lutetium-aluminum-garnet phosphor of general formula $(Lu_{1-x-y-a-b}Y_xGd_y)_3(Al_{1-z}Ga_z)_5O_{12}$:$Ce_aPr_b$ wherein $0<x<1$, $0<y<1$, $0<z \leq 0.1$, $0<a \leq 0.2$ and $0<b \leq 0.1$ together with a second phosphor. The second phosphor may be, for example, a red-emitting phosphor, such as a red emitting europium-activated phosphor selected from the group of $(Ca_{1-x}Sr_x)S$:Eu wherein $0<x \leq 1$ and $(Sr_{1-x-y}Ba_xCa_y)_{2-z}Si_{5-a}Al_aN_{8-a}O_a$:$Eu_z$ wherein $0 \leq a<5$, $0<x \leq 1$, $0 \leq y \leq 1$, and $0<z \leq 1$.

Preferably a europium activated calcium strontium sulfide is used, which is a high chromaticity red phosphor excitable from the near UV (400 nm) to the blue-green (500 nm) with high quantum efficiency. For an optimized use of this phosphor for luminescent conversion of primary LED light it is necessary to modify the photophysical characteristics to achieve, for example, efficacy, color specifications and life time of related light emitting devices. The chromaticity and quantum efficiency of the europium activated strontium sulfide can be modified through the substitution of divalent metal ions for strontium from the list including Ba, Ca, Mg, and Zn. Suitable red phosphors are described in the following table:

| Phosphor composition | $\lambda_{max}$ [nm] | Color point x, y |
|---|---|---|
| SrS:Eu | 610 | 0.627, 0.372 |
| $(Sr_{1-x-y}Ba_xCa_y)_2Si_5N_8$:Eu | 615 | 0.615, 0.384 |
| $(Sr_{1-x-y}Ba_xCa_y)_2Si_{5-x}Al_xN_{8-x}$:Eu | 615–650 | Depends on x, y |
| CaS:Eu | 655 | 0.700, 0.303 |
| $(Sr_{1-x}Ca_x)S$:Eu | 610–655 | Depends on x, y |

The phosphor blend comprises a mixture of predetermined amounts and relative proportions of garnet-structured lutetium-aluminum oxide activated by cerium and calcium-strontium sulfide activated by divalent europium. The relative phosphor proportions are such that the composite emission of the first phosphor layer falls approximately within the warm-white ellipse as inscribed on the x-y chromaticity diagram of the ICI system.

Figure 4A:
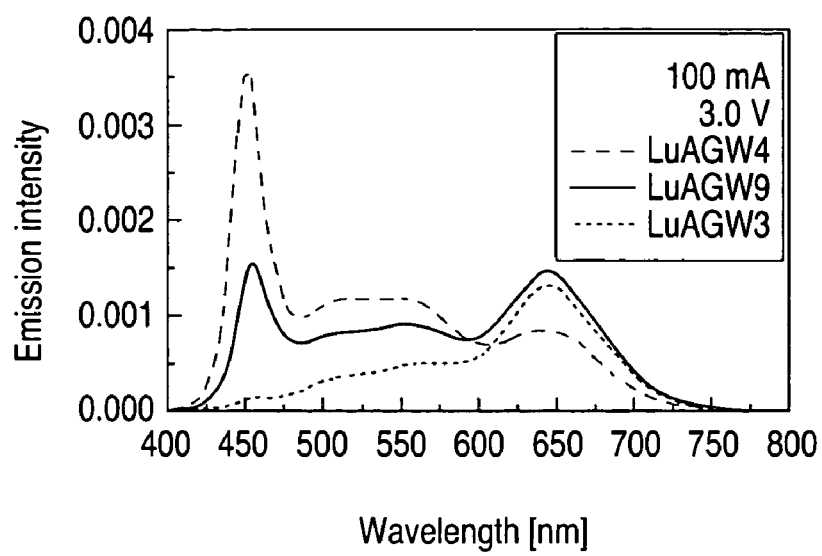
FIGS. 4A and 4B illustrates emission spectra of white LEDs.

Especially preferred is a white emitting radiation source comprising a InGaN chip, emitting in the blue range of the visible spectrum with a peak emission at 455 nm together with a phosphor blend comprising $Lu_3Al_5O_{12}$:Ce and CaS:Eu with the corresponding spectral weight ratio blue:green:red=1.1:2.4:2.18 which emits white light with color coordinates x=0.336 and y=0.339 and index of color rendering of 83. The spectra of such white emitting devices comprising three different blends of $Lu_3Al_5O_{12}$:Ce and CaS:Eu are given in FIG. 4A.

Figure 4B:
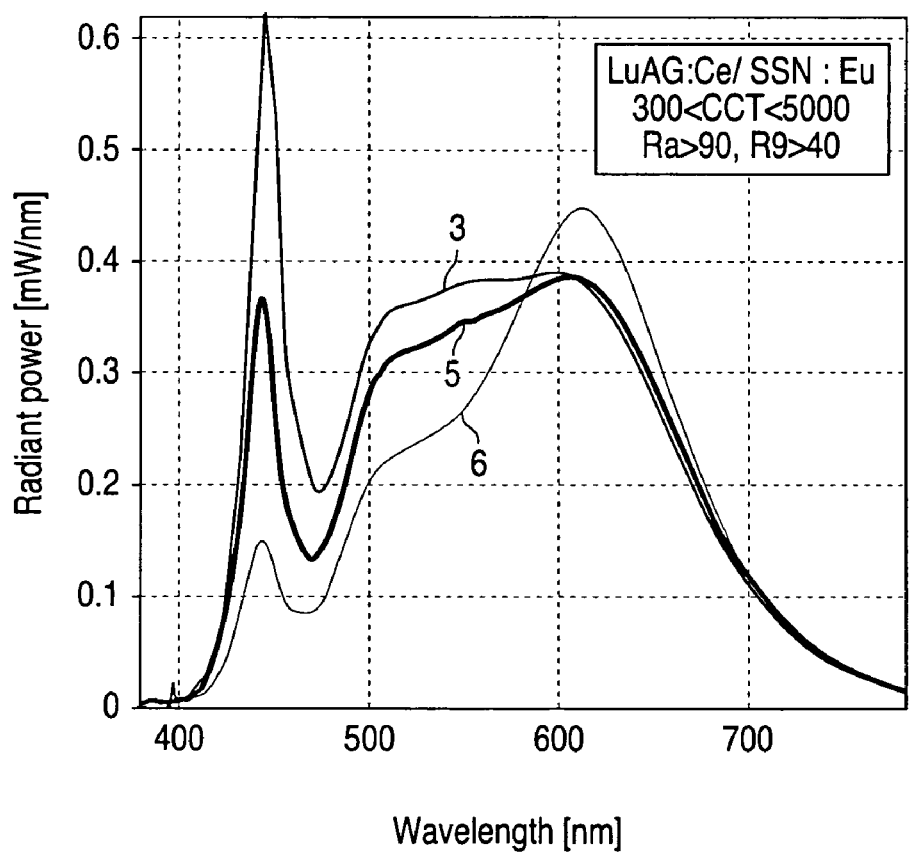

FIG. 4B illustrates spectra of three white devices including blends of $Lu_3Al_5O_{12}$:Ce and $Sr_2Si_5N_8$:Eu, excited by a blue LED at 450 nm.

A detailed construction of such a light-emitting device according to embodiments of the invention is shown in FIG. 1. The device of FIG. 1 comprises an LED 1 positioned in a reflector cup 2. A phosphor composition 4,5 is positioned in the path of light emitted by LED 1. The phosphor composition is embedded in a resin. The shape of reflector cup 2 may be selected to provide a particular pattern of light emitted from the device, as is known in the art. For example, the walls of reflector cup 2 can be parabolic.

In one embodiment, the device further comprises a polymer for encapsulating the phosphor or phosphor blend. In this embodiment, the phosphor or phosphor blend should exhibit high stability properties in the encapsulant. Preferably, the polymer is optically clear to prevent significant light scattering. In one embodiment, the polymer is selected from the group consisting of epoxy and silicone resins. A variety of polymers are known in the LED industry for making LED lamps. Adding the phosphor mixture to a liquid that is a polymer precursor can perform encapsulation. For example, the phosphor mixture can be a powder. Introducing phosphor particles into polymer precursor liquid results in formation of a slurry (i.e. a suspension of particles). Upon polymerization, the phosphor mixture is fixed rigidly in place by the encapsulation. In one embodiment, both the composition and the LED are encapsulated in the polymer.

The phosphors are applied either separately or in a mixture. The phosphors completely or partially absorb the light from the LED and emit it again in other spectral regions (primarily yellow and green) in a sufficiently broad band (specifically with a significant proportion of red) that an overall emission with the desired color point is formed. The wavelength of the LED is tuned to the particular phosphors in the blend such that each of the phosphors in the blend is excited by emission from the LED. A phosphor blend using wide band phosphors according to embodiments of the invention may have a relatively high color rendering index, as high as 91–93. In the case of an LED emitting UV light, for example between about 330 nm and about 365 nm, in order to achieve high color rendering, in addition to yellow/green and red phosphors described above, the phosphor blend may also include a phosphor that emits blue light.

The color points corresponding to a black body at various temperatures are given by the black body locus (BBL). Because the color emitted from a black body is considered to be white, and white light is generally desirable for a lamp, it is generally desirable that color point of the light emitted from the luminescent material of a luminescent lamp fall on or near the BBL. A portion of the BBL shown in FIG. 2A includes three color temperature points highlighted on the BBL corresponding to white light emitting LEDs, whose emission spectra are given in FIG. 4A. A portion of the BBL shown in FIG. 2B includes three color temperature points highlighted on the BBL corresponding to white light emitting LEDs, whose emission spectra are given in FIG. 4B.

Another figure of merit is the quality in rendering illuminated colors of a white light emitting radiation source, which is indicated as the color rendering index (CRI). A CRI of 100 is an indication that the light emitted from the light source is similar to that from a black body source, i.e. an incandescent or halogen lamp. A CRI of 85 to 95 can be attained by applying a phosphor mixture comprising $Lu_3Al_5O_{12}$:Ce and CaS:Eu to a blue-emitting LED.

Figure 2A:
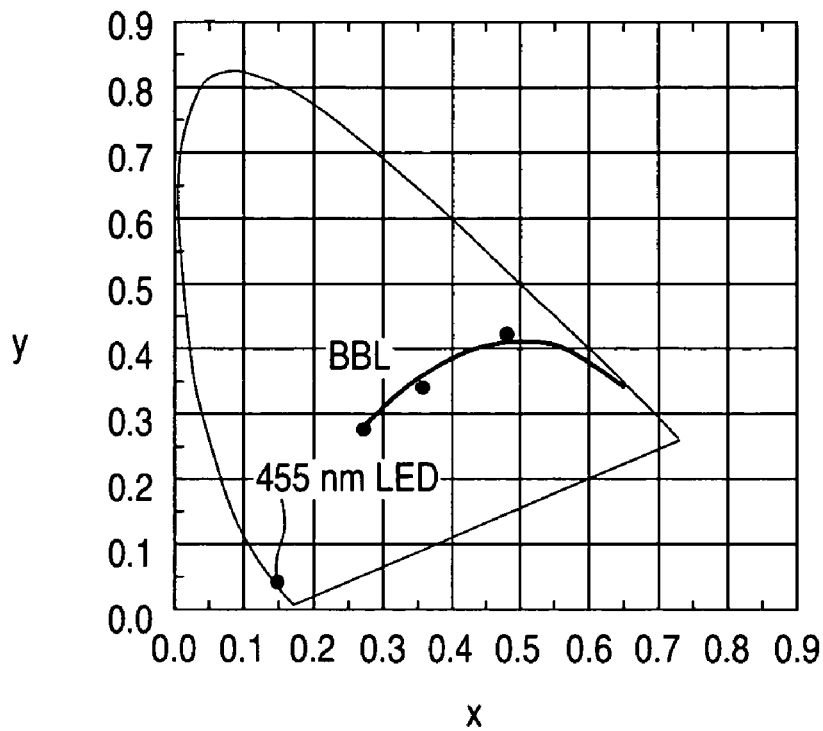
FIG. 2A shows the coordinates of phosphor mixtures of $(Lu_{0.495}Y_{0.495}Ce_{0.01})_3Al_5O_{12}$ and CaS in the chromaticity diagram of the Commission Internationals de l'Eclairage ("CIE").
Figure 2B:
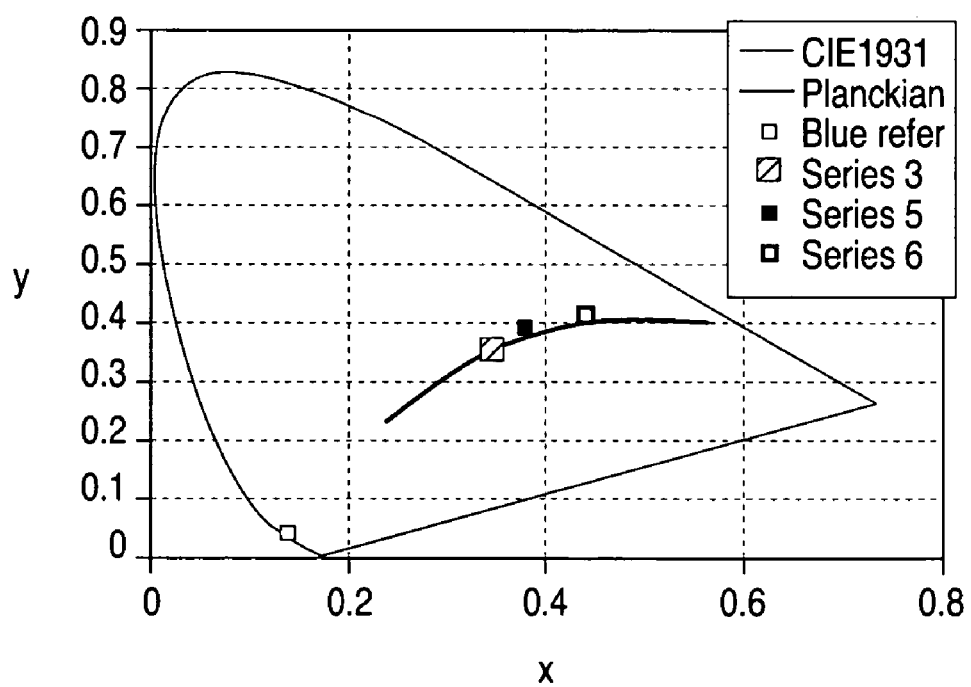
FIG. 2B shows the coordinates of phosphor mixtures of $Lu_3Al_5O_{12}$:$Ce^{3+}$ and $Sr_2Si_5N_8$:Eu in the CIE diagram. Blends of these phosphors may be produced to have coordinates close to the black body locus.

FIGS. 2A and 2B show the color coordinates of a range of illumination systems providing white light that can be produced from various combinations of blue LEDs and a cerium-activated lutetium-aluminum-garnet phosphor and CaS:Eu or $Sr_2Si_5N_8$:Eu of the present invention.

More than one phosphor according to embodiments of the present invention may be incorporated in the same device to provide for color adjustment.

A further group of embodiments is directed to a green emitting illumination system with particularly good color rendering comprising the combination of a light emitting semiconductor component which emits primary light in the blue spectral range from 420 to 480 nm together with a phosphor blend containing a green emitting cerium-activated lutetium-aluminum garnet phosphor $Lu_3Al_5O_{12}$:Ce, with the corresponding spectral weight ratio blue:green is chosen from 1.0:2.4 to 1.0:3.5 which emits green light with color coordinates x=0.336 and y=0.339, an index of color rendering of 83, and a lumen equivalent of about 450 lumen/Watt.

The green-emitting phosphor may be combined when appropriate, with a further yellow or red-emitting phosphor for the production of specific colored light and more preferably for production of white light with a high color-rendering index of greater than 80.

Figure 3:
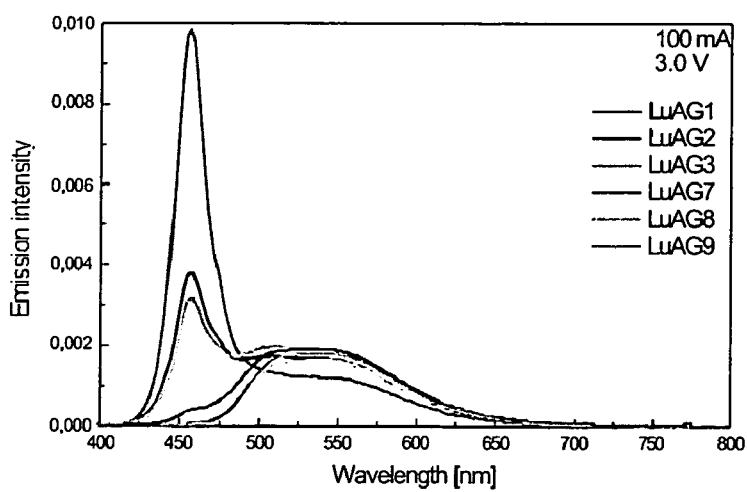
FIG. 3 illustrates emission spectra of green LEDs upon excitation by a blue LED at 460 nm.

As a result of the green to yellow broad-band emission, a green emission can be generated which is shown in some examples in FIG. 3. As the amount of phosphor disposed on the device increases, eventually all of the emission from the LED is absorbed, such that only emission from the phosphor remains. Devices with such heavy phosphor loading may be used in applications requiring green light.

Figure 8:
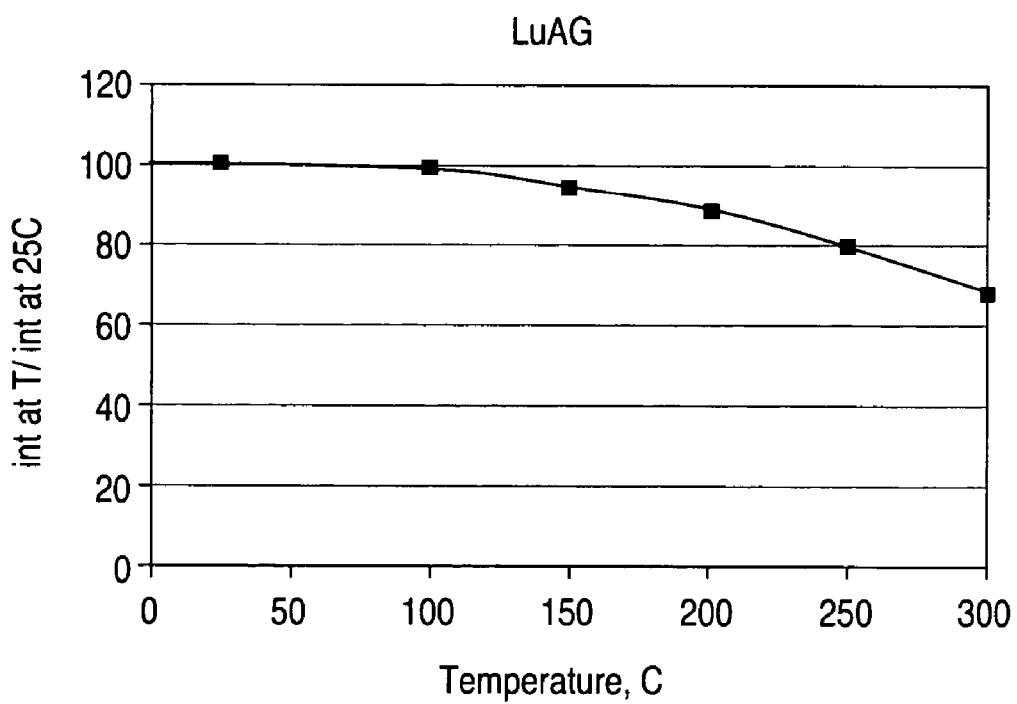
FIG. 8 illustrates the relative intensity of $Lu_3Al_5O_{12}$:$Ce^{3+}$ as a function of temperature.
Figure 9:
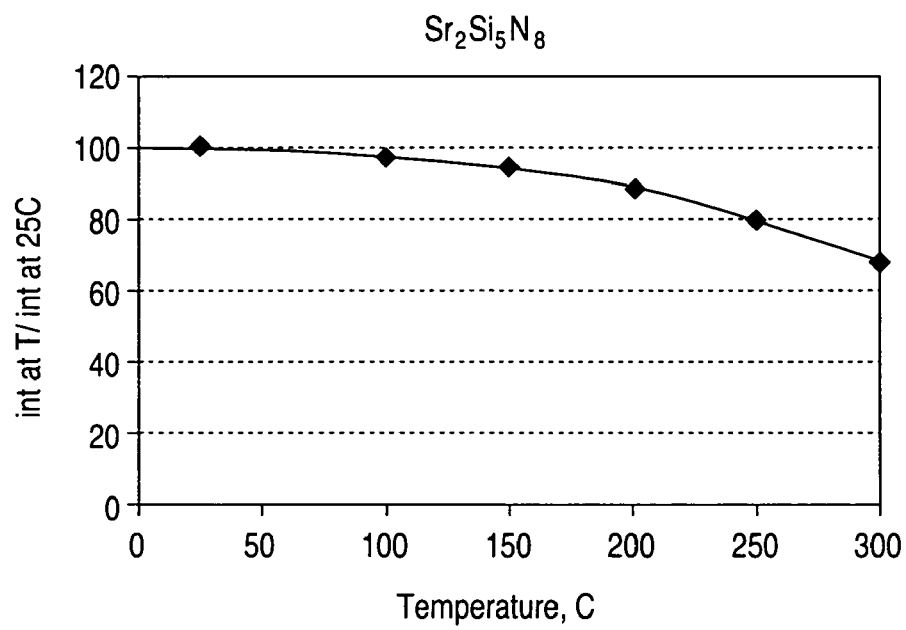
FIG. 9 illustrates the relative intensity of $Sr_2Si_5N_8$:$Eu^{2+}$ as a function of temperature.

The garnet phosphors described above emit a broad band in the yellow-green spectral range of the visible spectrum with very high intensity under both UV and blue excitations and thus can provide the green component in LEDs emitting specific colors or white light. Total conversion efficiency can be up to 90%. Additional important characteristics of the phosphors include 1) resistance to thermal quenching of luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties. FIG. 8 illustrates the relative intensity of $Lu_3Al_5O_{12}:Ce^{3+}$ as a function of temperature. The relative intensity is expressed as a percentage of the intensity at room temperature, 25° C. At 200° C., the $Lu_3Al_5O_{12}:Ce^{3+}$ emission intensity is 90% of room temperature intensity. At 300° C., the $Lu_3Al_5O_{12}:Ce^{3+}$ emission intensity is 70% of room temperature intensity. In embodiments requiring white light and operation at high temperature, $Sr_2Si_5N_8:Eu^{2+}$ is preferred as a red phosphor as it exhibits similar performance at high temperatures, as illustrated in FIG. 9, which illustrates the relative intensity of $Sr_2Si_5N_8:Eu^{2+}$ as a function of temperature. At 200° C., the $Sr_2Si_5N_8:Eu^{2+}$ emission intensity is 90% room temperature intensity.

Figure 10:
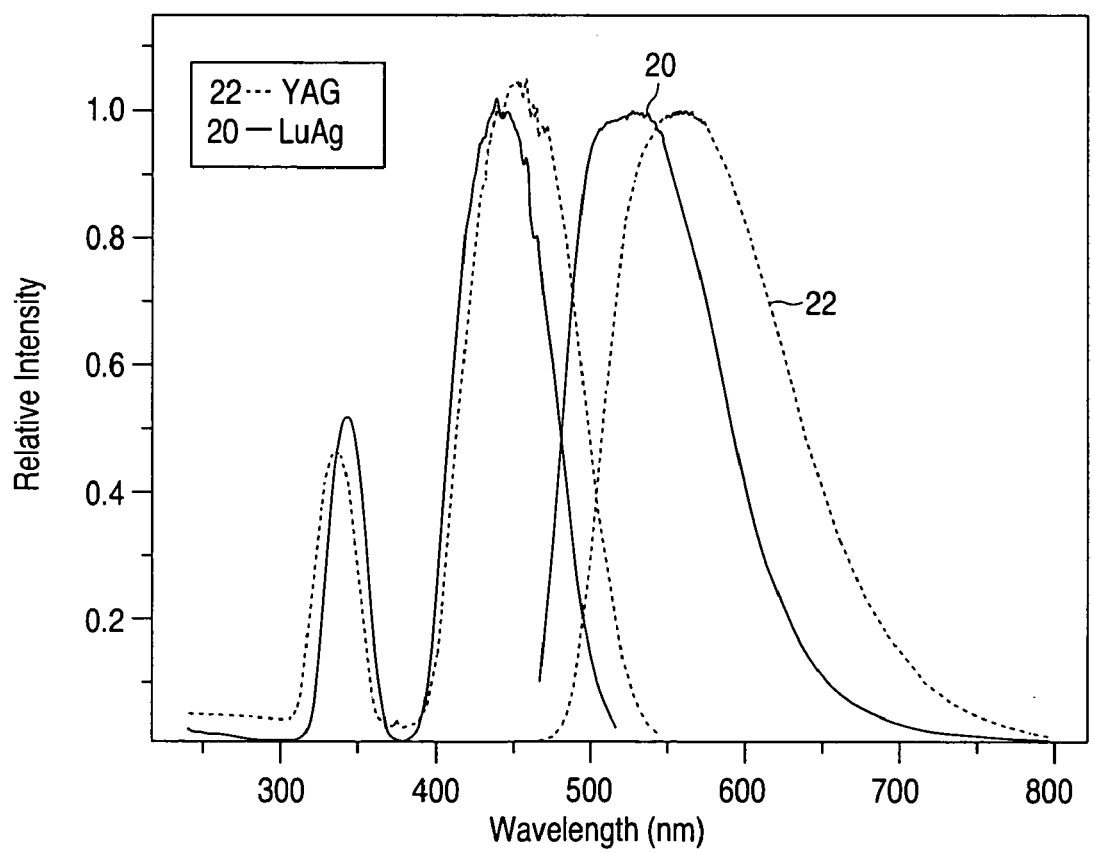
FIG. 10 illustrates excitation and emission spectra of $Lu_3Al_5O_{12}$:$Ce^{3+}$ and $Y_3Al_5O_{12}$:$Ce^{3+}$.

Lutetium-containing garnet phosphors included with other phosphors in devices designed to emit white light may offer improved color rendering over garnet phosphors that do not include lutetium, such as $Y_3Al_5O_{12}:Ce^{3+}$. The improved color rendering is due to the smaller Stokes' shift of $Lu_3Al_5O_{12}:Ce^{3+}$ relative to $Y_3Al_5O_{12}:Ce^{3+}$. Phosphors such as $Lu_3Al_5O_{12}:Ce^{3+}$ and $Y_3Al_5O_{12}:Ce^{3+}$ absorb an excitation energy typically in the form of radiation, store the energy, then emit the stored energy as radiation of a different energy. When the emitted radiation has less quantum energy than the absorbed radiation, the wavelength of the emitted light increases over the absorbed light. This increase is referred to as the Stokes' shift. FIG. 10 illustrates the smaller Stokes' shift of $Lu_3Al_5O_{12}:Ce^{3+}$ as demonstrated by excitation and emission spectra of $Lu_3Al_5O_{12}:Ce^{3+}$ and $Y_3Al_5O_{12}:Ce^{3+}$. Though the excitation spectra of both phosphors are very similar, the peak emission from $Lu_3Al_5O_{12}:Ce^{3+}$ (curve 20) occurs at a wavelength about 40 nm shorter than the peak emission from $Y_3Al_5O_{12}:Ce^{3+}$ (curve 22). When used in a white device, the smaller Stokes' shift of $Lu_3Al_5O_{12}:Ce^{3+}$ eliminates a gap in the spectrum of combined pump emission and phosphor emission at long blue wavelengths and short green wavelengths, resulting in better color rendering.

In a device where a red-emitting phosphor is mixed with a lutetium-containing garnet phosphor, such as the device illustrated in FIG. 1, it may be difficult to exploit the small Stokes' shift of the lutetium-containing garnet phosphor since the red-emitting phosphor may absorb a significant portion of the light emitted by the lutetium-containing garnet phosphor. Lutetium-containing garnet phosphors tend to be very dense. As a result, when a slurry containing such phosphors is deposited over a device, the lutetium-containing garnet phosphor particles tend to sink quickly, leaving most of the lutetium-containing garnet phosphor close to the device and most of the red-emitting phosphor further from the device. Light emitted by the lutetium-containing garnet phosphor thus has a high likelihood of striking a red-emitting phosphor particle and being absorbed. FIGS. 11–14 illustrate embodiments of the device where the red-emitting phosphor and lutetium-containing garnet phosphor are deposited such that absorption by the red-emitting phosphor of light emitted by the lutetium-containing garnet phosphor is minimized.

Figure 11:
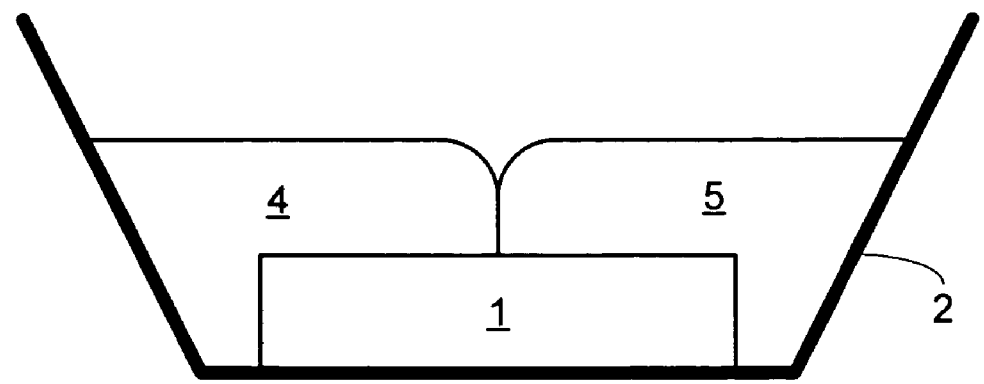
FIGS. 11, 12, 13, and 14 illustrate embodiments of the invention including multiple phosphors.

In the device illustrated in FIG. 11, the lutetium-containing garnet phosphor 5 is mixed with a resin or other transparent material and disposed on one side of reflector cup 2, while any other phosphors 4 are mixed separately with a resin or other transparent material and disposed on the other side of reflector cup 2, such that slurry 5 does not appreciably mix with slurry 4. In some embodiments, the viscosity of the transparent material forming the slurry is selected to avoid mixing phosphor 4 with phosphor 5. Since lutetium-containing garnet phosphor 5 and any other phosphors 4 are adjacent to each other, rather than mixed in the same slurry, light emitted by lutetium-containing garnet phosphor 5 is less likely to be absorbed by any red-emitting phosphors in slurry 4.

Figure 12:
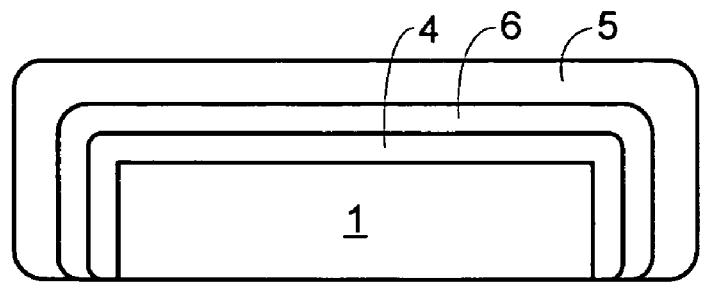

In the device illustrated in FIG. 12, the lutetium-containing garnet phosphor 5 and other phosphors 4 are deposited over LED 1 as discrete layers. Phosphor layer 4, including any red-emitting phosphors, is deposited closest to LED 1. Lutetium-containing garnet phosphor 5 is then deposited over phosphor layer 4. Phosphor layers 4 and 5 may be separated by an optional transparent layer 6. Phosphor layers 4 and 5 may be deposited as slurries in a resin or other transparent material; deposited as thin films by, for example, electron beam evaporation, thermal evaporation, rf-sputtering, chemical vapor deposition, or atomic layer epitaxy; or deposited as conformal layers over LED 1 by, for example, screen printing, stenciling as described in U.S. Pat. No. 6,650,044, or by electrophoretic deposition as described in U.S. Pat. No. 6,576,488. Thin films are described in more detail in U.S. Pat. No. 6,696,703. Each of U.S. Pat. No. 6,696,703, U.S. Pat. No. 6,650,044 and U.S. Pat. No. 6,576,488 are incorporated herein by reference. In contrast to a thin film, which typically behaves as a single, large phosphor particle, the phosphor in a conformal layer generally behaves as multiple phosphor particles. In addition a thin film typically contains no materials other than phosphor. A conformal layer often includes materials other than phosphor, such as, for example, silica.

Figure 13:
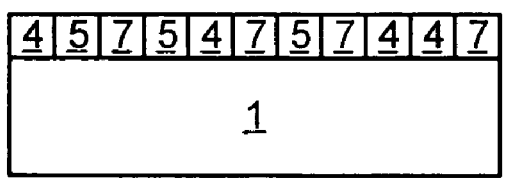

In the device illustrated in FIG. 13, the lutetium-containing garnet phosphor 5 and other phosphors 4 are deposited on LED 1 in a plurality of small regions. The different regions may form a pattern, such as a checkerboard pattern. If light from LED 1 is to escape unconverted, as in the case where blue light emitted by the LED mixes with green and red light emitted by phosphors to make white light, the amount of unconverted light may be controlled by controlling the thickness of phosphor regions 4 and 5, or by leaving regions of LED 1 uncovered, or covered by an optional transparent material 7 that does not convert the light emitted by LED 1. Patterns of different phosphor layers as illustrated in FIG. 13 may be formed by depositing a first layer of phosphor by electrophoretic deposition, patterning that layer using conventional lithography and etching techniques, then depositing a second phosphor layer by electrophoretic deposition. Alternatively, patterns of phosphor layers may be deposited by screen printing or ink jet printing. In some embodiments, a pattern of phosphor layers may be formed by pipetting the individual phosphor mixes 4 and 5 into wells in a clear plastic microplate used for microbiology. The phosphor-filled microplate is then placed on LED 1. Phosphor-filled microplates may be formed separately from LED 1.

Figure 14:
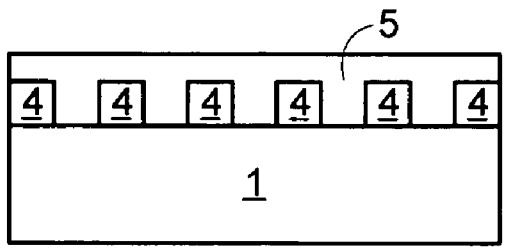

In the device illustrated in FIG. 14, a plurality of small regions of phosphor 4, which includes any red-emitting phosphors, is formed on the surface of LED 1. A layer of lutetium-containing garnet phosphor 5 is then deposited over the plurality of regions of phosphor 4.

Each of the embodiments illustrated in FIGS. 11–14 avoid the problem of light being absorbed and reemitted by the lutetium-containing garnet phosphor prior to being incident on a red-emitting phosphor. In each case, light emitted by LED 1 is incident on the red-emitting phosphor first, or is incident on the red-emitting phosphor and the lutetium-containing garnet phosphor in separate regions. The arrangements illustrated in FIGS. 11–14 thus reduce the probability of light emitted from the lutetium-containing garnet phosphor being absorbed by a red-emitting phosphor.

Lutetium-containing garnet phosphors according to the present invention are easily synthesized, as illustrated in the following example:

EXAMPLE

For the phosphor synthesis of a phosphor of general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, one or more of the starting materials may be oxygen-containing compounds such as oxides, nitrates, sulfates, acetates, citrates, or chlorates, which are soluble in a nitric acid solution. For example, amounts of $Lu_2O_3$, $Al(NO_3)_3\cdot9H_2O$, $Ce(NO_3)_3\cdot6H_2O$ and $AlF_3$ are blended and dissolved in a nitric acid solution. The strength of the acid solution is chosen to rapidly dissolve the oxygen-containing compounds and the choice is within the skill of a person skilled in the art. The nitric acid solution is evaporated. The dried precipitate is ball milled or otherwise thoroughly blended and then calcined in a CO-atmosphere at about 1300° C. for a sufficient time to ensure a substantially complete dehydration of the starting material. The calcination may be carried out at a constant temperature. Alternatively, the calcinations temperature may be ramped from ambient to and held at the final temperature for the duration of the calcination. After an intermittent milling step the calcined material is similarly fired at 1500–1700° C. under a reducing atmosphere such as $H_2$, CO, or a mixture of one of these gases with an inert gas. The calcined material is fired for a sufficient time for the decomposition of the oxygen-containing compounds to convert all of the calcined material to the desired phosphor composition.

The resulting powder is milled on a roller bench for several hours. The milled powder has an average particle size of 40 to 60 μm. Its quantum efficiency is 90% and its lumen equivalent is between 430 and 470 lm/W. The color point is at x=0.33 to 0.38, y=0.57 to 0.58. The table below gives the wavelength and color point of several suitable phosphor compounds.

| Phosphor composition | $\lambda_{max}$ [nm] | Color point x, y |
|---|---|---|
| $(Lu_{0.99}Ce_{0.01})_3Al_5O_{12}$ | 515 + 540 | 0.339, 0.579 |
| $(Lu_{0.989}Ce_{0.010}Pr_{0.001})_3Al_5O_{12}$ | 515 + 540 + 610 | 0.332, 0.574 |
| $(Lu_{0.495}Y_{0.495}Ce_{0.01})_3Al_5O_{12}$ | 525 + 550 | 0.377, 0.570 |
| $(Lu_{0.75}Gd_{0.24}Ce_{0.01})_3Al_5O_{12}$ | 520 + 545 | 0.350, 0.573 |

Figure 5:
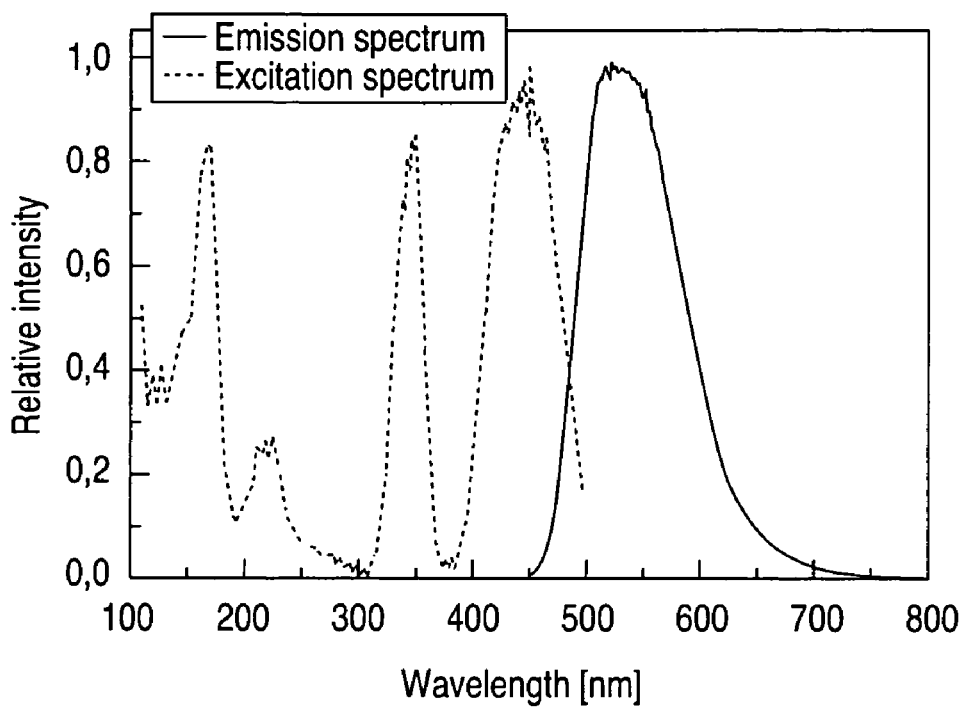
FIG. 5 illustrates the excitation and emission spectra of $(Lu_{0.99}Ce_{0.01})_3Al_5O_{12}$.
Figure 6:
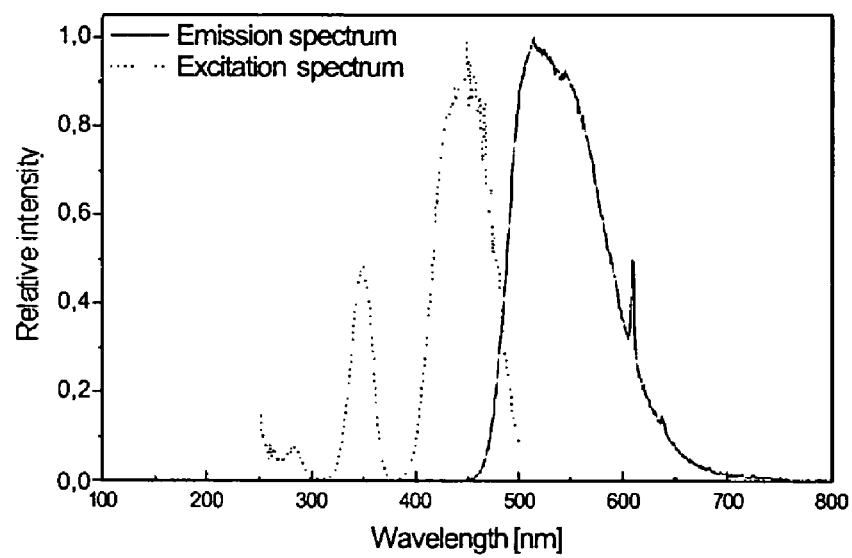
FIG. 6 illustrates the excitation and emission spectra of $(Lu_{0.989}Ce_{0.01}Pr_{0.001})_3Al_5O_{12}$.
Figure 7:
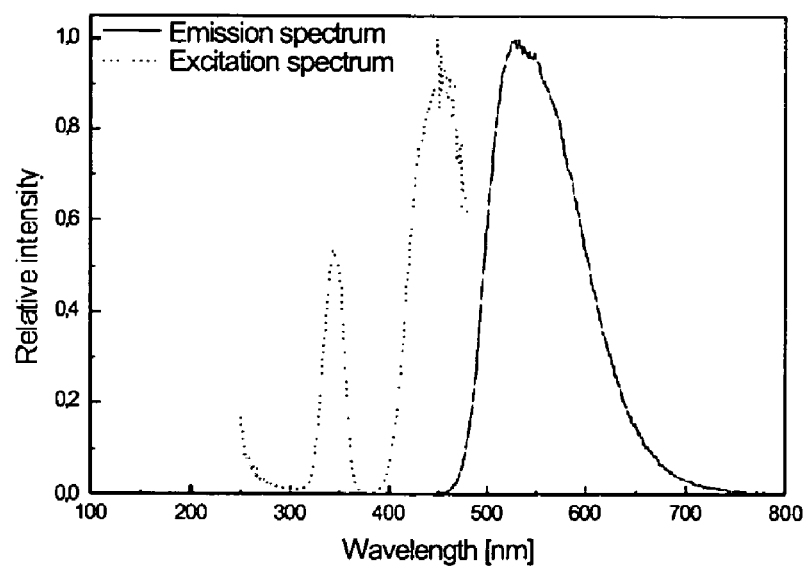
FIG. 7 illustrates the excitation and emission spectra of $(Lu_{0.495}Y_{0.495}Ce_{0.01})_3Al_5O_{12}$.

FIGS. 5, 6, and 7 illustrate the emission spectra of some of the compounds in the above table. When excited with radiation of wavelength 355 nm, these garnet phosphors are found to give a broad band emission, which peaks at 515 nm. FIG. 5 shows excitation and emission spectra for the composition $(Lu_{0.99}Ce_{0.01})_3Al_5O_{12}$. FIG. 6 shows excitation and emission spectra for the composition $(Lu_{0.495}Y_{0.495}Ce_{0.01})_3Al_5O_{12}$. FIG. 7 demonstrates that the excitation band of $(Lu_{0.989}Ce_{0.010}Pr_{0.001})_3Al_5O_{12}$, is a broad band (515–540 nm) with a peak extending from 515–540 nm and a side band at 610 nm.

From the excitation spectra, it is also clear that these cerium-activated lutetium-aluminum garnet phosphors can be excited efficiently with radiation of wavelength 254 as well as 355 and 420 nm.

For manufacturing a white illumination system based on a 460 nm emitting InGaN LED, a phosphor blend comprising at least one of the suitable red phosphors described above is suspended into a silicone precursor. A droplet of this suspension is deposited onto the LED chip and subsequently polymerized. A plastic lens seals the LED.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A system comprising:
   a radiation source capable of emitting first light; and
   a fluorescent material capable of absorbing the first light and emitting second light having a different wavelength than the first light, wherein said fluorescent material comprises a phosphor having the formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$.

2. The system of claim 1 wherein the first light comprises light having a peak emission wavelength in the range of 400 to 480 nm.

3. The system of claim 1 wherein the first light comprises light having a peak emission wavelength in the range of 438 to 456 nm.

4. The system of claim 1 wherein the first light comprises light having a peak emission wavelength in the range of 330 to 365 nm.

5. The system of claim 1 wherein the radiation source is a light emitting diode.

6. The system of claim 1 wherein the second light is green light.

7. The system of claim 1 wherein the fluorescent material is a first fluorescent material, the system further comprising a second fluorescent material capable of emitting third light.

8. The system of claim 7 wherein the third light comprises red light.

9. The system of claim 7 wherein the second fluorescent material comprises an Eu(II)-activated phosphor.

10. The system of claim 7 wherein the second fluorescent material comprises $(Sr_{1-x-y}Ba_xCa_y)_2Si_{5-x}Al_xN_{8-x}O_x:Eu$ wherein $0\leq a<5$, $0<x\leq1$, $0\leq y\leq1$, and $0<z\leq1$.

11. The system of claim 7 wherein the second fluorescent material comprises $Sr_2Si_5N_8:Eu^{2+}$.

12. The system of claim 7 wherein the second fluorescent material comprises $(Sr_{1-x}Ca_x)S:Eu$.

13. The system of claim 7 wherein:
   the first fluorescent material and the second fluorescent material are disposed over the radiation source as discrete layers; and
   the second fluorescent material is closer to the radiation source than the first fluorescent material.

14. The system of claim 13 further comprising a layer of transparent material disposed between the first fluorescent material and the second fluorescent material.

15. The system of claim 7 wherein:
the first fluorescent material is disposed over a first portion of the radiation source; and
the second fluorescent material is disposed over a second portion of the radiation source.

16. The system of claim 7 wherein:
the first fluorescent material is disposed over the radiation source in a plurality of first discrete regions; and
the second fluorescent material is disposed over the radiation source in a plurality of second discrete regions.

17. The system of claim 16 wherein the plurality of first discrete regions and the plurality of second discrete regions form a pattern.

18. The system of claim 16 further comprising a transparent material disposed over the radiation source in a plurality of third discrete regions.

19. The system of claim 7 wherein:
the second fluorescent material is disposed over the radiation source in a plurality of first discrete regions; and
the first fluorescent material is disposed over the second fluorescent material.

20. The system of claim 7 further comprising a third fluorescent material capable of emitting fourth light.

21. The system of claim 20 wherein the fourth light comprises blue light.

22. The system of claim 1 wherein particles of the first fluorescent material are coated with a layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

* * * * *

UNITED STATES PATENT AND TRADEMARK OFFICE
CERTIFICATE OF CORRECTION

| | | |
|---|---|---|
| PATENT NO. | : 7,038,370 B2 | Page 1 of 1 |
| APPLICATION NO. | : 10/785620 | |
| DATED | : May 2, 2006 | |
| INVENTOR(S) | : Regina B. Mueller-Mach et al. | |

It is certified that error appears in the above-identified patent and that said Letters Patent is hereby corrected as shown below:

Column 10, line 55, claim 10: Cancel "$(Sr_{1-x-y}Ba_xCa_y)_2Si_{5-x}Al_xN_{8-x}O_x:Eu$" and substitute
$\quad\quad\quad$--$(Sr_{1-x-y}Ba_xCa_y)_{2-z}Si_{5-a}Al_aN_{8-a}O_a:Eu_z$--.

Column 10, line 61, claim 12: Cancel "Eu." and substitute
$\quad\quad\quad$--Eu wherein $0 < x \leq 1$.--.

Signed and Sealed this

Twenty-eighth Day of November, 2006

JON W. DUDAS
*Director of the United States Patent and Trademark Office*